United States Patent
Fong et al.

(10) Patent No.: US 7,231,627 B2
(45) Date of Patent: Jun. 12, 2007

(54) MERGING A HARDWARE DESIGN LANGUAGE SOURCE FILE WITH A SEPARATE ASSERTION FILE

(75) Inventors: David Fong, San Jose, CA (US); Zheng (Joy) Zhang, Shanghai (CN); Qi (Christine) Chen, Shanghai (CN)

(73) Assignee: VIA Technologies, Inc., Taipei (TW)

( * ) Notice: Subject to any disclaimer, the term of this patent is extended or adjusted under 35 U.S.C. 154(b) by 182 days.

(21) Appl. No.: 11/125,991

(22) Filed: May 10, 2005

(65) Prior Publication Data

US 2006/0259884 A1    Nov. 16, 2006

(51) Int. Cl.
*G06F 17/50*    (2006.01)

(52) U.S. Cl. .......................................... 716/18; 716/11

(58) Field of Classification Search .................... 716/1, 716/11, 16, 18
See application file for complete search history.

(56) References Cited

U.S. PATENT DOCUMENTS 6,237,007 B1 *  5/2001  Brown ..................... 707/104.1

* cited by examiner

*Primary Examiner*—Thuan Do
(74) *Attorney, Agent, or Firm*—Thomas, Kayden, Horstemeyer & Risley

(57) ABSTRACT

A method is provided for merging assertions in one input file with hardware description language (HDL) code in another input file to produce an HDL output file. One embodiment, among others, comprises the steps of: copying an assertion identified by an assertion identifier from the first input file; locating a matching assertion identifier within a section of the second input file; and merging the assertion with the section of the second input file to produce a section in the HDL output file.

14 Claims, 7 Drawing Sheets

MERGING A HARDWARE DESIGN LANGUAGE SOURCE FILE WITH A SEPARATE ASSERTION FILE

FIELD OF THE INVENTION

The present invention relates to software tools for designing digital integrated circuits, and more specifically, to a tool for using hardware design language assertions.

BACKGROUND

Designers of digital integrated circuits (ICs) use various software tools to design an IC. The design engineer typically writes code in a Hardware Design Language (HDL), also known as a Register Transfer Language (RTL). The IC designer then runs a simulator which tests the design using the HDL code as input. After fixing any problems found in the code by the simulation process, the HDL code is then used as input by a synthesizer. The synthesizer translates the HDL code into a physical representation of an IC, which can then be produced as a physical IC in the form of an Field Programmable Gate Array (FPGA), Application-Specific Integrated Circuit (ASIC), or custom silicon IC.

During the simulation process, a verification engineer instruments the HDL code with assertions to verify that the HDL code is an accurate implementation of the intended design. An assertion is a statement which expresses how a particular design feature should or should not behave. For example, the code for a particular logic block may assume that only one of two input signals is active at any one time. As another example, a logic block may assume that an input will never be larger than a certain maximum value. As yet another example, a logic block may assume that a request signal will remain asserted until after an acknowledge signal is asserted. Each of these assumptions made by the designer can be expressed as assertion.

After creating these assertions, the verification engineer typically inserts the assertions into appropriate areas of the HDL source file. However, this manual insertion method is not desirable because both the design engineer and the verification engineer need to update the same file. Source-code control tools can be used to prevent the two engineers from updating the file at the same time. Using such systems, one engineer "checks out" the file, makes his changes, and checks it back in.

In addition, the type of assertion whether using PSL or SVA (System Verilog Assertion) can be determined at merge time. This allows the IC designer to choose the "best" type of assertion to use for his/her purposes. The current fad may be to use OVL (Open Verification Library) but within two years it will be SVA which has more powerful capabilities. In any case, the specific identifier remains with the RTL code to increase the documentation purpose also.

However, the process of inserting assertions manually is still problematic, since while the verification engineer is creating the assertions and instrumenting the HDL code with them, the HDL source file is unavailable to the design engineer. By not inserting verbose assertion information, the RTL code remains cleaner and is not obfuscated by other types of coding. Therefore, a better process of integrating assertions with HDL source code is needed.

SUMMARY

A method is provided for merging assertions in one input file with hardware description language (HDL) code in another input file to produce an HDL output file. One embodiment, among others, comprises the steps of: copying an assertion identified by an assertion identifier from the first input file; locating a matching assertion identifier within a section of the second input file; and merging the assertion with the section of the second input file to produce a section in the HDL output file.

DESCRIPTION OF THE DRAWINGS

Many aspects of the invention can be better understood with reference to the following drawings. The components in the drawings are not necessarily to scale, emphasis instead being placed upon clearly illustrating the principles of the present invention.

DETAILED DESCRIPTION

Figure 1:
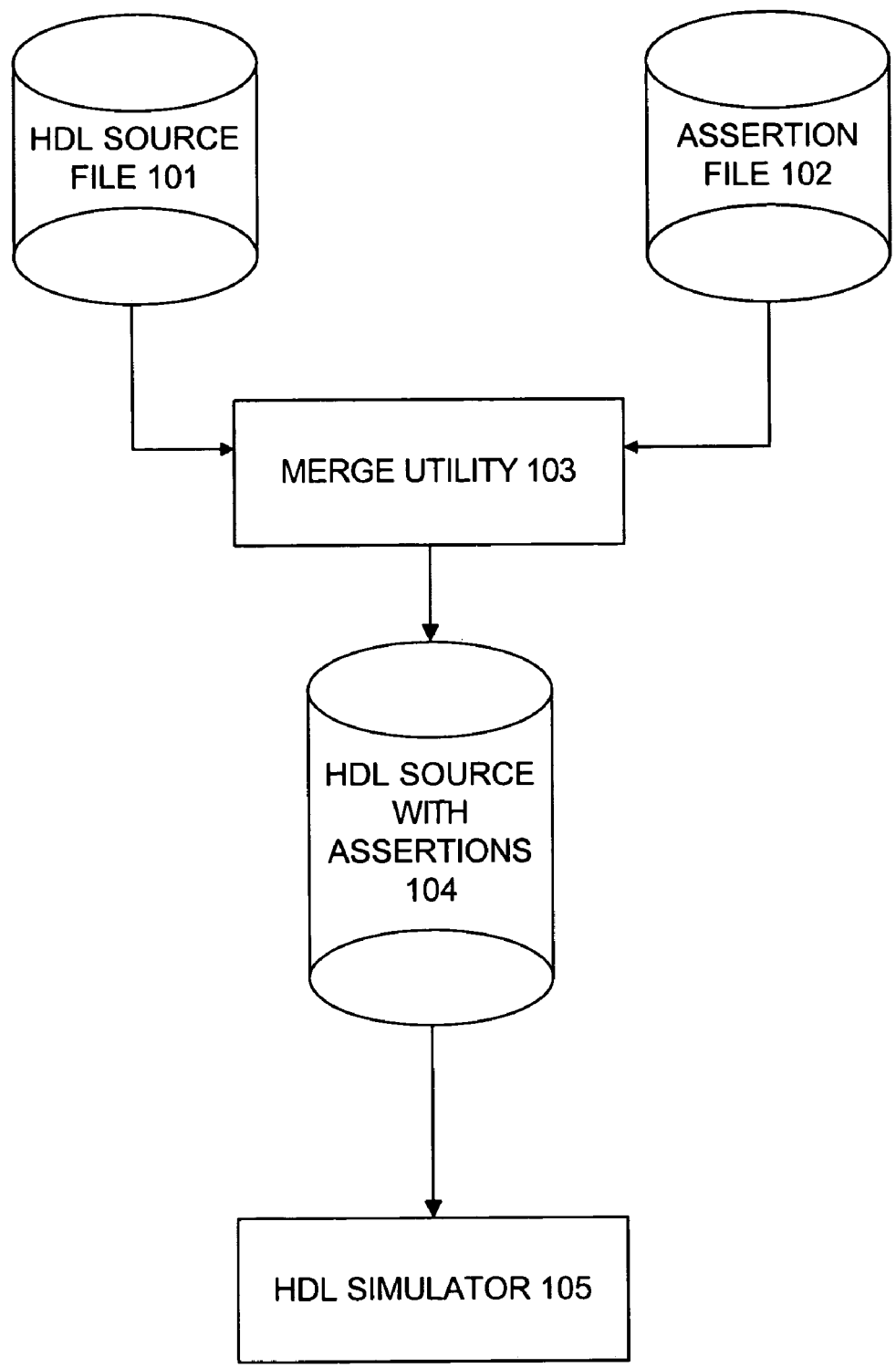
FIG. 1 is a block diagram illustrating the overall data flow in using the method of merging assertions with an HDL source file.

FIG. 1 is a block diagram illustrating the overall data flow in using the method of merging assertions with an HDL source file. Two input files are used: the HDL source file 101 and the assertion file 102. The HDL source file 101 contains HDL source code written in a particular hardware description language (e.g., VHDL, Verilog, SystemC). The assertion file 102 contains assertions, written in a particular assertion language, which may be the same as the language of HDL source file 101 (e.g., VHDL, System Verilog), or which may be different (e.g., Property Specification Language, Open Vera).

The two input files are processed by a merge utility 103, a computer program that implements the merge method. The merge utility 103 produces an HDL output file 104 that contains the original HDL source code and the assertions, merged according to directives in the HDL source file 101. The merged output file 104 can then be used as input by the HDL simulator 105.

One skilled in the art will realize that the merge utility program can be implemented in a variety of languages, both scripted and compiled. A non-limiting list of scripting languages includes perl, awk, shell script, and VBScript. A non-limiting list of compiled languages includes C, C++, C#, Java, and Visual Basic.

Figure 2:
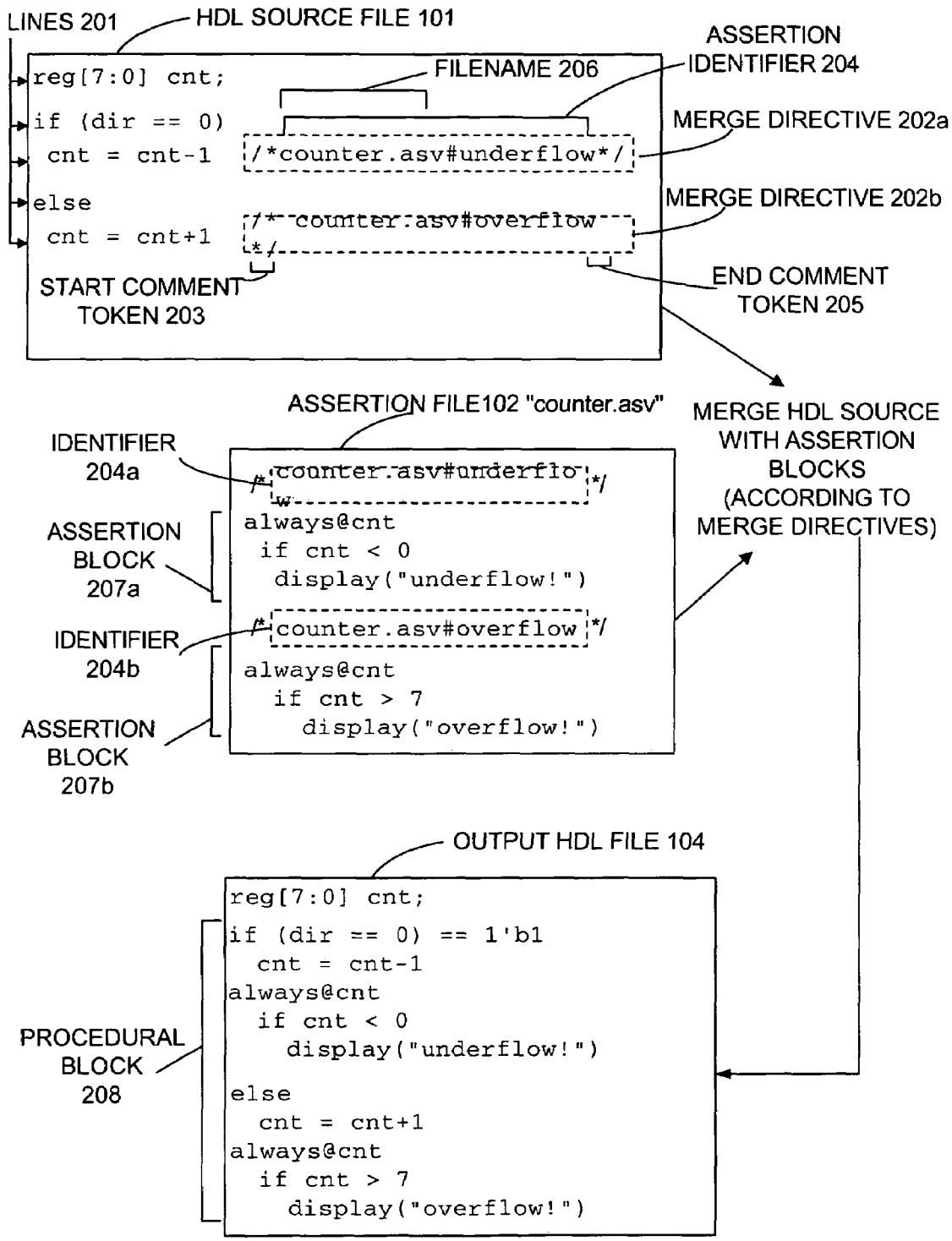
FIG. 2 is a block diagram illustrating the operation of one embodiment of the method for merging assertions with an HDL source file.

FIG. 2 is a block diagram illustrating the operation of one embodiment of the method for merging assertions with an HDL source file. HDL source file 101 contains lines 201 of HDL source code. In the example embodiment of FIG. 2, the source code is written in Verilog. Other embodiments support source code written in VHDL, SystemC, and System Verilog. The merge method processes each line 201 in the HDL source file 101, copying each line to the HDL output file 104. Each line in the HDL source file 101 is examined to determine if it contains a merge directive 202. If the current line 201 does contain a merge directive 202, the line is processed further.

A merge directive 202 consists of a start comment token 203 followed by an assertion identifier 204, followed by an end comment token 205. (HDL comments are used for the merge directive 202 so that the synthesizer and the simulator will ignore the directive.) The merge directive 202 is parsed to extract the assertion identifier 204. The assertion identifier 204 is further parsed to extract the name (206) of the assertion file (102) containing the assertion to be merged.

Merging the line 201 containing the merge directive 202 with a corresponding assertion in the assertion file 102 is accomplished as follows. The assertion file 102 is processed to locate an assertion block with an assertion identifier 204 that matches the identifier in the HDL source file 101. If no assertion block matching the assertion identifier 204 is found, an error is reported. If a match is found, the matching assertion block is copied to the output file 104.

In the example embodiment of FIG. 2, an assertion block begins with the line after the matching assertion identifier, and ends at the next occurrence of any assertion identifier. Thus, the portion of the example assertion file 102 shown in FIG. 2 has two assertion blocks, 207a and 207b. Assertion block 207a has 3 lines, starting with the line after assertion identifier 204a, but does riot include the line containing the next identifier, assertion identifier 204b. Assertion block 207b also contains 3 lines starting with the line after assertion identifier 204b.

One skilled in the art will realize that assertion blocks can be delineated in other ways. For example, in another embodiment, an assertion block includes the matching assertion identifier. In this case, the matching assertion identifier is copied to the output file 104 along with the rest of the assertion block. In yet another embodiment, the end of an assertion block is explicitly marked by an ending assertion identifier (e.g., another occurrence of the matching assertion identifier).

The start comment token 203 and end comment token 205 within the merge directive 202 are specific to the language used in HDL source file 101. Verilog supports two sets of comment tokens: "//" for the start comment token, paired with the end-of-line marker for the end comment token; or "/*" for the start token, paired with "*/" for the end. VHDL uses "--" for the start comment token, paired with the end-of-line marker for the end comment token. Other languages using other comment tokens are also within the scope of the invention.

In the example of FIG. 2, the assertion block is placed after the line containing the merge directive. This is appropriate for languages such as Verilog, VHDL, and System-Verilog, which support assertions as part of the native language. An assertion is simply another type of statement supported by the language. Since the syntax doesn't allow multiple statements on a line, an assertion must be on a line separate from the code being verified.

In other languages, however, assertions can take the form of comments which are inline with (on the same line as) the code being verified. These comments are handled by a pre-processor. Examples of languages supporting inline assertions include, for example, PSL and Sugar. An example of an inline PSL assertion is:

cnt=cnt-1; //PSL assert_underflow(cnt<0);

The method for merging assertions with an HDL source file supports both inline assertions and non-inline assertions. If the language supports assertions embedded in comments, the method places the assertion inline with the line containing the merge directive, provided the assertion is a single line. If the assertion takes more than a single line, the method places the assertion in the context of the code, but within comments.

If the assertion is native to the language, then the method places the assertion block in the context of the language. Usually, proper context requires the assertion block to start on the following statement line. In the case of multi-line flow control statements like "case" or "if else" then the assertion will be placed below the multi-line complex language statement.

Many other details of the example embodiment shown in FIG. 2 need not be described in order to understand the overall operation of the assertion merge method. The format of the merge directive 202 assertion filename 206 contained within the merge directive 202 is specific to the operating system used for the design environment. Thus, if a Unix environment is used, then the filename 206 should conform to the Unix filename format. This example uses a "#" character to separate the assertion filename 206 from the assertion identifier 204, but any delimiter can be used.

In FIG. 2, merge directives 202a and 202b operate to embed assertion block 207a and assertion block 207b in a procedural block of HDL code (208). In this particular example, the procedural block is a IF-ELSE construct. However, HDL languages support various other kinds of procedural blocks too (e.g., FOR, CASE, etc.) and merge directives can be used to embed assertion blocks in any kind of procedural block. This kind of embedded assertion block is sometimes called an "immediate assertion."

Figure 3:
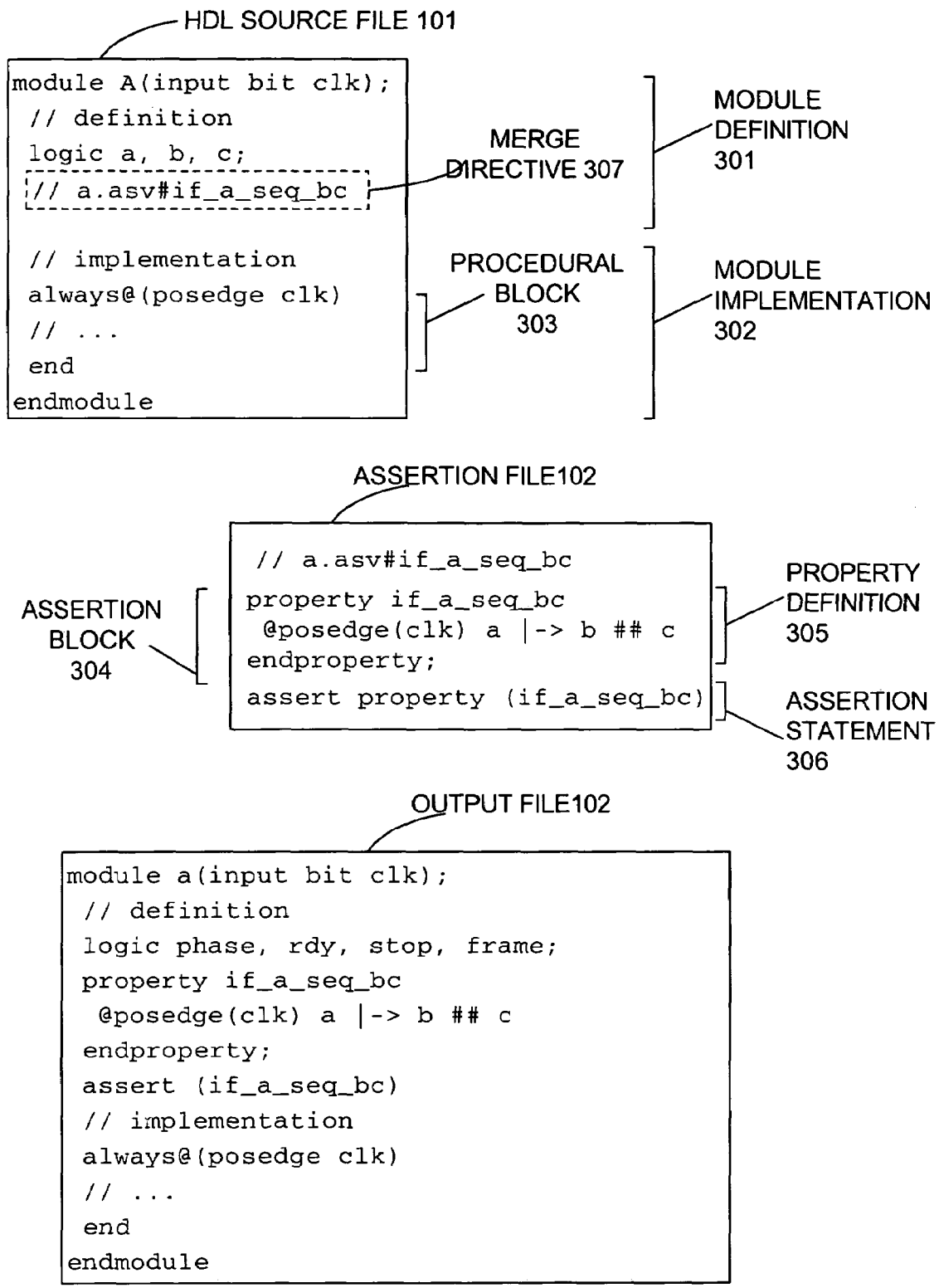
FIG. 3 is a block diagram illustrating the operation of another embodiment of the method for merging assertions with an HDL source file.

The method of merging assertions with an HDL source file can also be used to insert assertion blocks outside of any procedural block. FIG. 3 illustrates this type of usage. HDL source file 101 contains SystemVerilog code for module A, which includes a module definition section 301 followed by a module implementation section 302. The module definition section 301 defines module A's interface to other modules. The module implementation section 302 implements module A's behavior using a procedural block such as block 303. Assertion file 102 contains assertion block 304, which contains a property definition (305) and an assertion statement (306). The assertion block 304 makes sure that once signal a is asserted, signal b is asserted on the next clock cycle, and signal c is asserted on the clock cycle after that.

In this example, merge directive 307 is used to insert assertion block 304 into the module definition section 301 of module A. Since the assertion block is outside any procedural block, the property is evaluated during simulation from beginning to end, rather than being evaluated as part of a procedural block. This type of assertion block is particularly useful to verify the behavior of an interface between logic blocks, where the type of assertion block illustrated in FIG. 2 is most useful to verify behavior within a logic block. (The first type is sometimes call "black-box testing" while the second is called "white-box testing.")

Figure 4:
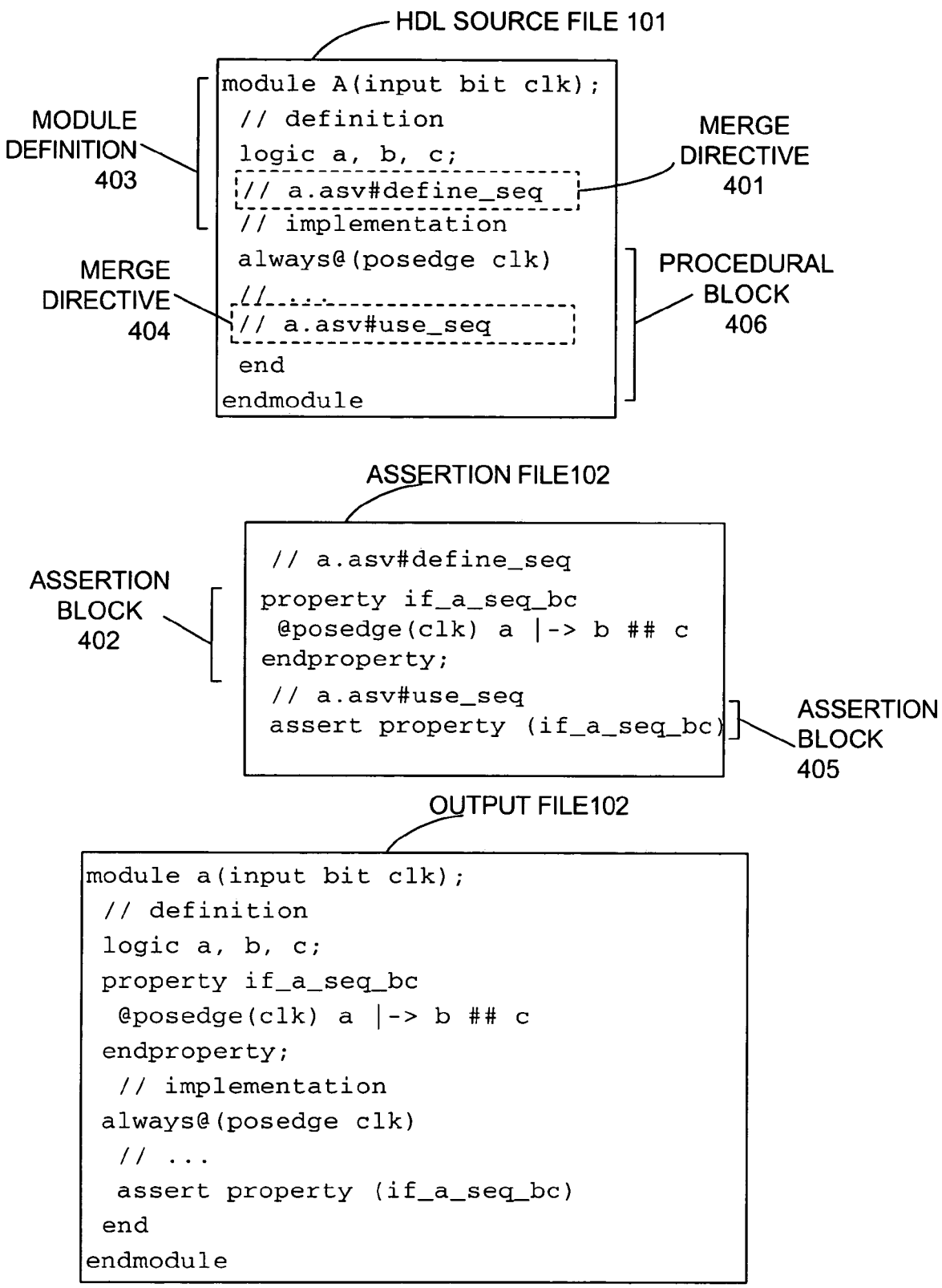
FIG. 4 is a block diagram illustrating the operation of yet another embodiment of the method for merging assertions with an HDL source file.
Figure 5:
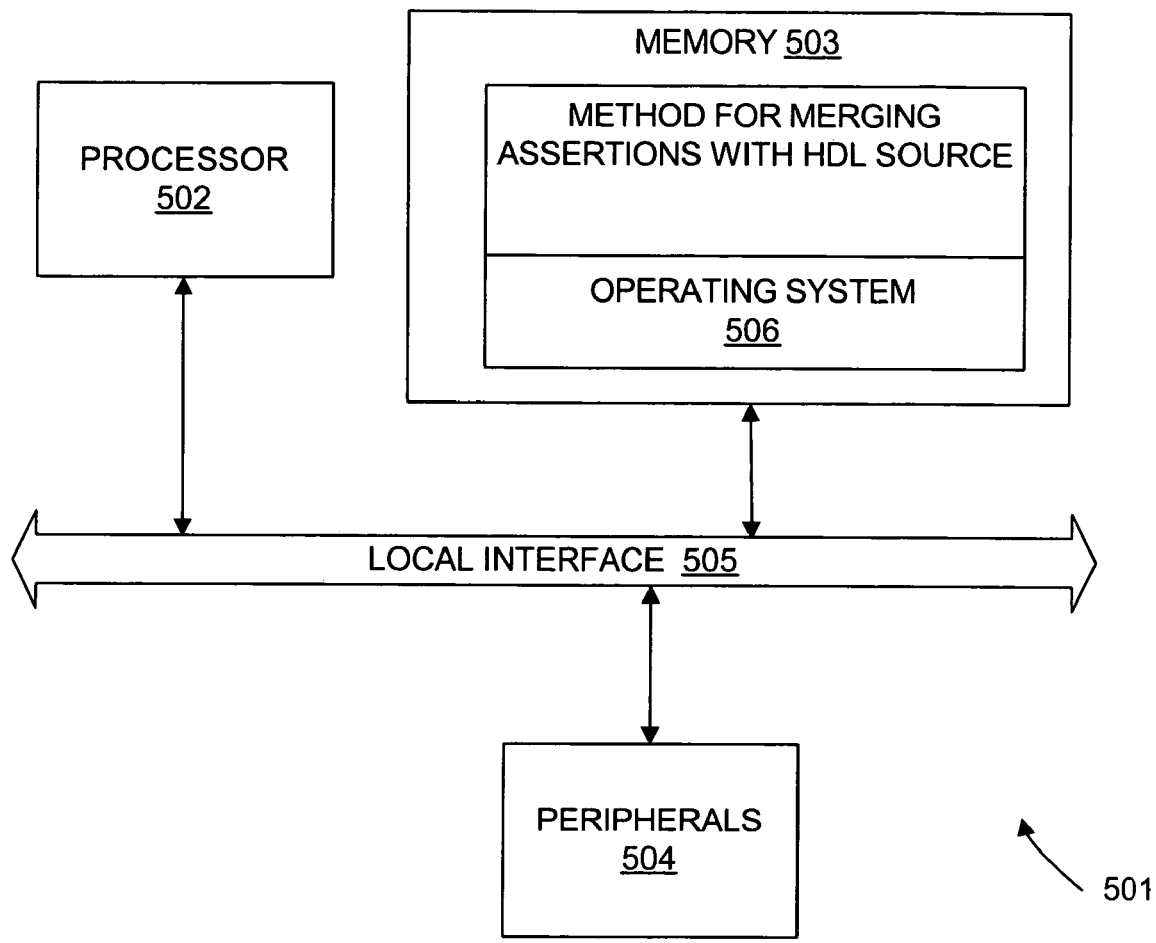
FIG. 5 is a block diagram of a general-purpose computer system that can be used to implement an embodiment of the method for merging assertions with an HDL source file.

Another example of using the method of merging assertions with an HDL source file is illustrated in FIG. 4. In this example, the property is defined outside a procedural block, but is evaluated inside a procedural block. To handle this type of assertion, two merge directives are used. Merge directive 401 inserts assertion block 402 (containing the property definition) within the module definition 403. Merge directive 404 inserts the assertion block 405 (using the property) within the always procedural block 406;

FIG. 5 is a block diagram of a general-purpose computer system that can be used to implement an embodiment of the method for merging assertions with an HDL source file. One skilled in the art will realize that the method can execute on the same system that executes the other IC design tools (editor, synthesizer, compiler, simulator, debugger, etc.), or it can execute remotely on a server system (e.g., in an X-Windows environment). Generally, in terms of hardware architecture, the computer 501 includes a processor 502, memory 503, and one or more input or output (I/O) devices or peripherals 504 that are communicatively coupled via a local interface 505. The local interface 505 can be, for example but not limited to, one or more buses or other wired or wireless connections, as is known in the art. The local interface 505 may have additional elements (omitted for simplicity), such as controllers, buffers, drivers, repeaters, and receivers, to enable communications. Further, the local interface 505 may include address, control, and data connections to enable appropriate communications among the aforementioned components.

The processor 502 is a hardware device for executing software, particularly that stored in memory 503. The processor 502 can be any custom made or commercially available processor, a central processing unit (CPU), an auxiliary processor among several processors associated with the computer 501, a semiconductor based microprocessor (in the form of a microchip or chip set), a microprocessor, or generally any device for executing software instructions.

The memory 503 can include any one or combination of volatile memory elements (e.g., random access memory (RAM, such as DRAM, SRAM, SDRAM, etc.)) and non-volatile memory elements (e.g., ROM, hard drive, tape, CDROM, etc.). Moreover, the memory 503 may incorporate electronic, magnetic, optical, or other types of storage media. Note that the memory 503 can have a distributed architecture, where various components are situated remote from one another, but can be accessed by the processor 502.

The software in memory 503 may include one or more separate programs, each of which comprises an ordered listing of executable instructions for implementing logical functions. In the example of FIG. 2, the software in the memory 503 includes one or more components of the system for communicating abnormal medical findings, and a suitable operating system 506. The operating system 506 essentially controls the execution of other computer programs, such as the method for merging assertions with an HDL source file, and provides scheduling, input-output control, file and data management, memory management, and communication control and related services.

The method for merging assertions with an HDL source file is a source program, executable program (object code), script, or any other entity comprising a set of instructions to be performed. When a source program, then the program needs to be translated via a compiler, assembler, interpreter, or the like, which may or may not be included within memory 503, so as to operate properly in connection with the operating system 506.

The peripherals 504 may include input devices, for example but not limited to, a keyboard, mouse, scanner, microphone, etc. Furthermore, the peripherals 504 may also include output devices, for example but not limited to, a printer, display, facsimile device, etc. Finally, the peripherals 504 may further include devices that communicate both inputs and outputs, for instance but not limited to, a modulator/demodulator (modem; for accessing another device, system, or network), a radio frequency (RF) or other transceiver, a telephone interface, a bridge, a router, etc.

If the computer 501 is a PC, workstation, or the like, the software in the memory 503 may further include a basic input output system (BIOS). The BIOS is a set of essential software routines that initialize and test hardware at startup, start the operating system 506, and support the transfer of data among the hardware devices. The BIOS is stored in the ROM so that the BIOS can be executed when the computer 501 is activated.

When the computer 501 is in operation, the processor 502 is configured to execute software stored within the memory 503, to communicate data to and from the memory 503, and to generally control operations of the computer 501 in accordance with the software. The system for communicating abnormal medical findings and the operating system 506, in whole or in part, but typically the latter, are read by the processor 502, and perhaps buffered within the processor 502, and then executed.

It should be noted that the method for merging assertions with an HDL source file can be stored on any computer readable medium for use by or in connection with any computer related system or method. In the context of this document, a "computer-readable medium" can be any means that can store, communicate, propagate, or transport the program for use by or in connection with the instruction execution system, system, or device. The computer-readable medium can be, for example but not limited to, an electronic, magnetic, optical, electromagnetic, infrared, or semiconductor system, system, device, or propagation medium. A non-exhaustive example set of the computer-readable medium would include the following: an electrical connection having one or more wires, a portable computer diskette, a random access memory (RAM), a read-only memory (ROM), an erasable programmable read-only memory (EPROM, EEPROM, or Flash memory), and a portable compact disc read-only memory (CDROM). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In an alternative embodiment, where the method for merging assertions with an HDL source file is implemented in hardware, it can be implemented with any or a combination of the following technologies, which are each well known in the art: a discrete logic circuit(s) having logic gates for implementing logic functions upon data signals, an application specific integrated circuit(s) (ASIC) having appropriate combinatorial logic gates, a programmable gate array(s) (PGA), a field programmable gate array(s) (FPGA), etc.

Figure 6:
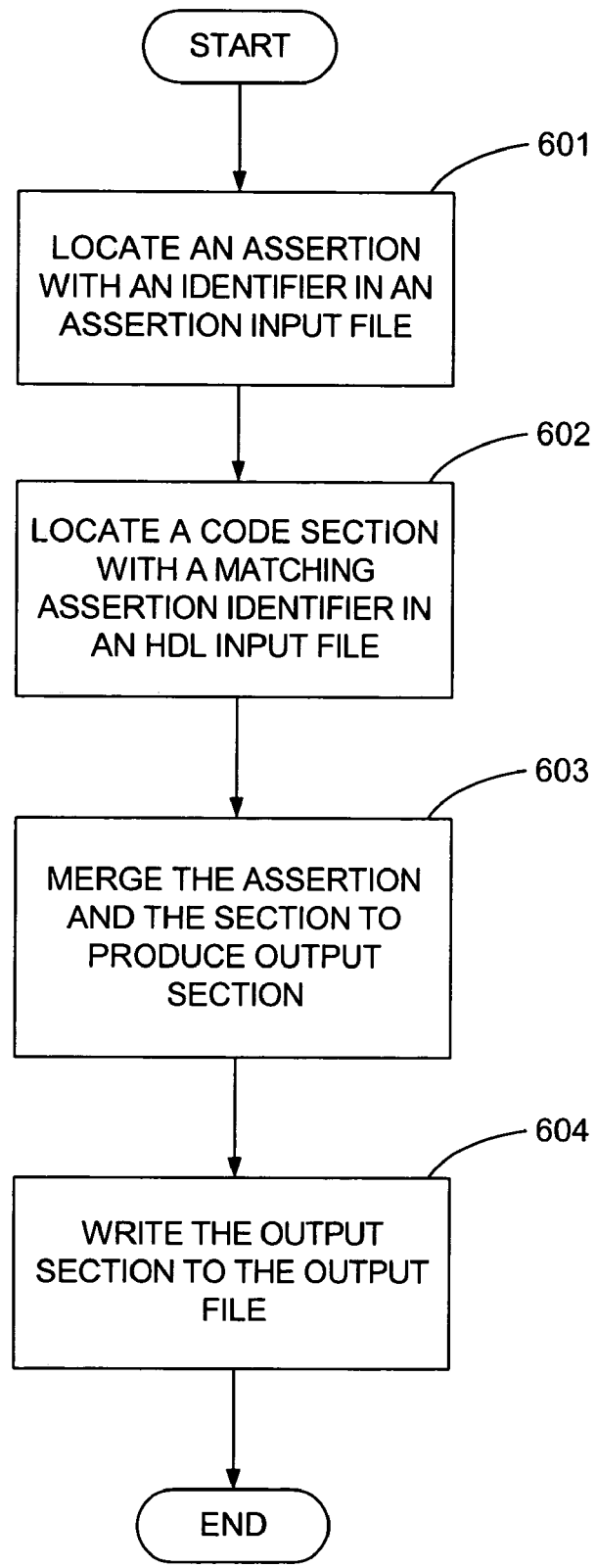
FIG. 6 is a flow chart of one embodiment of the method for merging assertions with an HDL source file.

FIG. 6 is a flowchart of one embodiment of the method for merging assertions with an HDL source file. The process begins at step 601, which locates an assertion block in an assertion input file. The assertion block has an identifier, and may consist of a single line or multiple lines. Next, at step 602, a second input file containing HDL code is processed to locate a code section which contains a matching assertion identifier. (If no matching code section is found, error processing such as displaying an error message may take place. Such error processing is well-known to those of skill in the art, and is not shown in FIG. 6).

Next, at step 603, the assertion from the assertion input file and the code section from the source code input file are merged together to produce an output section. In some embodiments, the merge is a straight concatenation of the source code line containing the assertion identifier with the assertion block identified with the same identifier. In other embodiments, the merge may place a single-line assertion block on the same line as the source code line. Such variations will depend on the specifics of the HDL code language and the assertion language, and the text processing required for these variations is understood by one of ordinary skill in the art.

Figure 7:
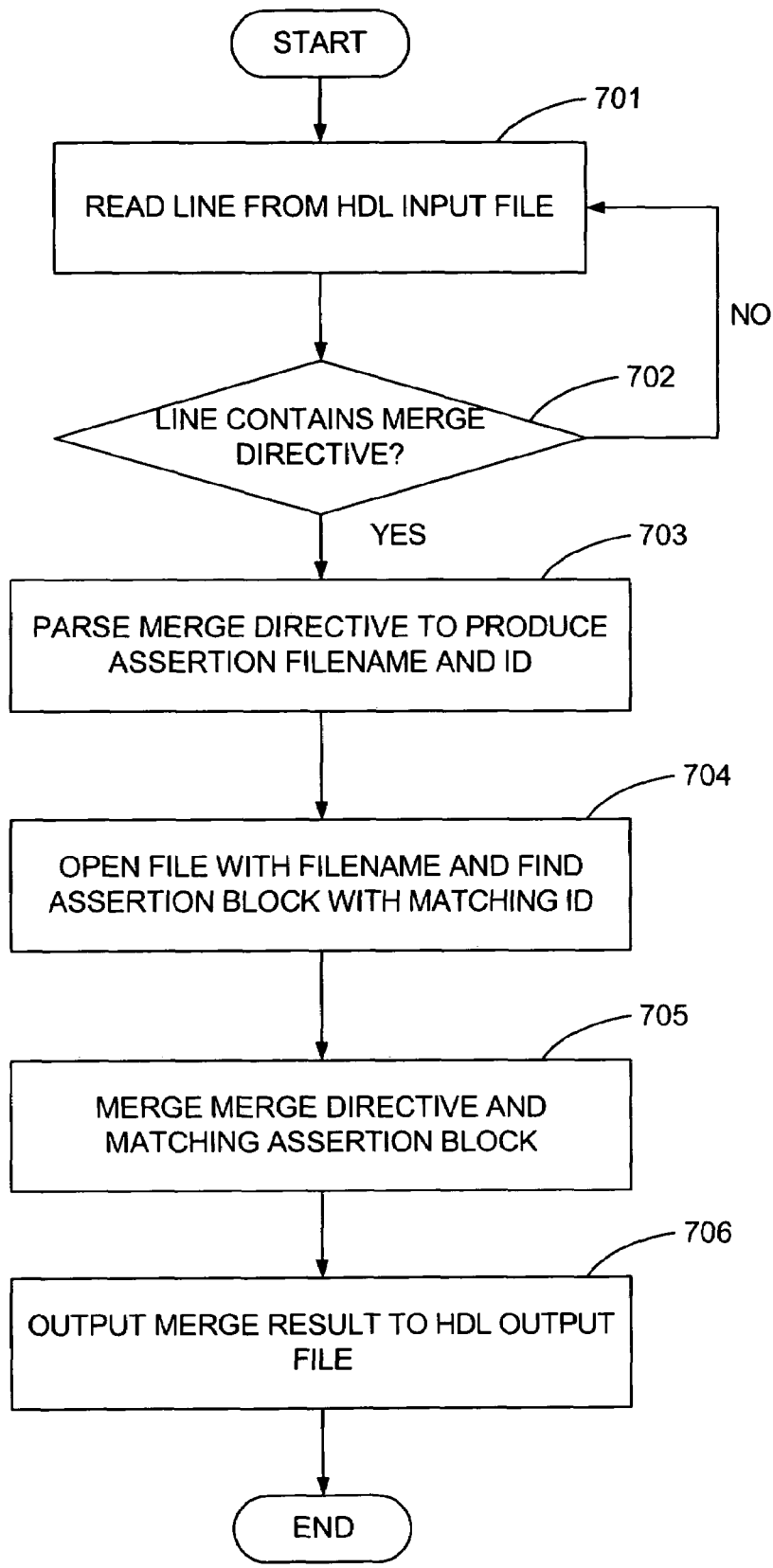
FIG. 7 is a flow chart of another embodiment of the method for merging assertions with an HDL source file.

FIG. 7 is a flowchart of another embodiment of the method for merging assertions with an HDL source file. The process begins at step 701, which reads a line from an HDL input file. At step 702, the process determines if the line contains a merge directive, and if not, continues at step 701. If the line does contain a merge directive, the process proceeds to step 703, where the merge directive is parsed to produce an assertion filename and an assertion identifier. Next, at step 704, the file identified by the filename is opened, and processed to find an assertion block that contains an identifier matching the identifier in the merge directive. At step 705, the process merges the line containing the merge directive and the matching assertion block, to produce a merge result. At step 706, the merge result is output to the HDL output file.

The foregoing description has been presented for purposes of illustration and description. It is not intended to be exhaustive or to limit the invention to the precise forms disclosed. Obvious modifications or variations are possible in light of the above teachings. The embodiments discussed, however, were chosen and described to illustrate the principles of the invention and its practical application to thereby enable one of ordinary skill in the art to utilize the invention in various embodiments and with various modifications as are suited to the particular use contemplated. All such modifications and variation are within the scope of the invention as determined by the appended claims when interpreted in accordance with the breadth to which they are fairly and legally entitled.

Therefore, having thus described the invention, at least the following is claimed:

1. A method for merging assertions in a first input file with hardware description language (HDL) code in a second input file to produce an HDL output file, the method comprising:
    copying an assertion from the first input file, the assertion identified by a first assertion identifier;
    locating a second assertion identifier within a section of the second input file, the second assertion identifier matching the first assertion identifier; and
    merging the assertion with the section of the second input file to produce a section in the HDL output file, wherein the merging further comprises concatenating the assertion and the section of the second input file to produce an output section and writing the output section to the HDL output file.

2. The method of claim 1, wherein the locating step further comprises:
    locating, within a section of the second input file, a second assertion identifier identical to the first assertion identifier.

3. The method of claim 1, further comprising:
    locating, in the first input file, an assertion block comprising a first assertion identifier followed by one or more lines of HDL code, the lines of HDL code defining an assertion; and
    copying the assertion to the output file.

4. The method of claim 1, further comprising:
    locating, in the first input file, an assertion block comprising a comment character followed by a first assertion identifier followed by one or more lines of HDL code, the lines of HDL code defining an assertion; and
    copying the assertion to the output file.

5. The method of claim 1, wherein the HDL code is Verilog.

6. The method of claim 1, wherein the HDL code is VHDL.

7. The method of claim 1, where the first input file is distinct from the second input file and the second input file is distinct from the output file.

8. A computer readable medium having a program for merging and executing assertions in a first input file with hardware description language (HDL) code in a second input file to produce an HDL output file, the program comprising logic for performing the steps of:
    copying an assertion from the first input file, an assertion identified by a first assertion identifier;
    locating a second assertion identifier within a section of the second input file, the second assertion identifier matching the first assertion identifier;
    merging the assertion with the section of the second input file to produce a section in the HDL output file;
    concatenating the assertion and the section of the second input file to produce an output section; and
    writing the output section to the HDL output file.

9. The computer readable medium of claim 8, the program further comprising the step of:
    locating, within a section of the second input file, a second assertion identifier identical to the first assertion identifier.

10. The computer readable medium of claim 8, the program further comprising the step of:
    locating, in the first input file, an assertion block comprising a first assertion identifier followed by one or more lines of HDL code, the lines of HDL code defining an assertion; and
    copying the assertion to the output file.

11. The computer readable medium of claim 8, the program further comprising the step of:
    locating, in the first input file, an assertion block comprising a comment character followed by a first assertion identifier followed by one or more lines of HDL code, the lines of HDL code defining an assertion; and
    copying the assertion to the output file.

12. The computer readable medium of claim 8, wherein the HDL code is Verilog.

13. The computer readable medium of claim 8, wherein the HDL code is VHDL.

14. The computer readable medium of claim 8, where the first input file is distinct from the second input file and the second input file is distinct from the output file.

* * * * *